(12) United States Patent
Beyer et al.

(10) Patent No.: US 8,329,549 B2
(45) Date of Patent: Dec. 11, 2012

(54) ENHANCING INTEGRITY OF A HIGH-K GATE STACK BY PROTECTING A LINER AT THE GATE BOTTOM DURING GATE HEAD EXPOSURE

(75) Inventors: Sven Beyer, Dresden (DE); Frank Seliger, Dresden (DE); Gunter Grasshoff, Radebeul (DE)

(73) Assignee: Advanced Micro Devices Inc., Austin, TX (US)

( * ) Notice: Subject to any disclaimer, the term of this patent is extended or adjusted under 35 U.S.C. 154(b) by 76 days.

(21) Appl. No.: 12/624,672

(22) Filed: Nov. 24, 2009

(65) Prior Publication Data

US 2010/0136762 A1 Jun. 3, 2010

(30) Foreign Application Priority Data

Nov. 28, 2008 (DE) .................. 10 2008 059 647

(51) Int. Cl.
  *H01L 21/336* (2006.01)
(52) U.S. Cl. .. 438/303; 438/689; 438/595; 257/E21.409
(58) Field of Classification Search .......... 438/299–301, 438/303–304, 595–596, 778, 689, 694–696
  See application file for complete search history.

(56) References Cited

U.S. PATENT DOCUMENTS

| | | | |
|---|---|---|---|
| 6,987,061 B2* | 1/2006 | Mehrotra ...................... | 438/682 |
| 7,314,810 B2* | 1/2008 | Jung et al. ..................... | 438/445 |
| 7,344,984 B2* | 3/2008 | Hoentschel et al. .......... | 438/682 |
| 7,381,622 B2* | 6/2008 | Hellmich et al. ............. | 438/300 |
| 7,381,623 B1* | 6/2008 | Chen et al. .................... | 438/300 |
| 7,435,682 B2* | 10/2008 | Matsui et al. ................. | 438/691 |
| 7,642,147 B1* | 1/2010 | Kanakasabapathy ......... | 438/199 |
| 7,838,366 B2* | 11/2010 | Lin et al. ....................... | 438/275 |
| 7,883,979 B2* | 2/2011 | Chen et al. .................... | 438/300 |
| 2005/0042831 A1* | 2/2005 | Mehrotra ...................... | 438/275 |
| 2005/0051851 A1* | 3/2005 | Chen et al. .................... | 257/369 |
| 2005/0074932 A1* | 4/2005 | Lin et al. ....................... | 438/199 |
| 2005/0191835 A1* | 9/2005 | Kim ............................... | 438/592 |
| 2006/0134916 A1* | 6/2006 | Prince et al. .................. | 438/692 |
| 2007/0108530 A1* | 5/2007 | Ogawa et al. ................. | 257/369 |
| 2007/0123010 A1* | 5/2007 | Hoentschel et al. .......... | 438/486 |
| 2007/0259501 A1* | 11/2007 | Xiong et al. .................. | 438/283 |
| 2008/0085590 A1* | 4/2008 | Yao et al. ...................... | 438/583 |
| 2008/0093675 A1* | 4/2008 | Yao et al. ...................... | 257/384 |
| 2009/0218633 A1* | 9/2009 | Hoentschel et al. .......... | 257/369 |
| 2010/0078728 A1* | 4/2010 | Li et al. ......................... | 257/369 |
| 2010/0087038 A1* | 4/2010 | Chung et al. .................. | 438/199 |
| 2010/0136762 A1* | 6/2010 | Beyer et al. ................... | 438/301 |

* cited by examiner

*Primary Examiner* — Savitr Mulpuri
(74) *Attorney, Agent, or Firm* — Williams, Morgan & Amerson (57) ABSTRACT

Sophisticated gate stacks including a high-k dielectric material and a metal-containing electrode material may be covered by a protection liner, such as a silicon nitride liner, which may be maintained throughout the entire manufacturing sequence at the bottom of the gate stacks. For this purpose, a mask material may be applied prior to removing cap materials and spacer layers that may be used for encapsulating the gate stacks during the selective epitaxial growth of a strain-inducing semiconductor alloy. Consequently, enhanced integrity may be maintained throughout the entire manufacturing sequence, while at the same time one or more lithography processes may be avoided.

17 Claims, 9 Drawing Sheets

ENHANCING INTEGRITY OF A HIGH-K GATE STACK BY PROTECTING A LINER AT THE GATE BOTTOM DURING GATE HEAD EXPOSURE

BACKGROUND OF THE INVENTION

1. Field of the Invention

Generally, the present disclosure relates to the fabrication of highly sophisticated integrated circuits, including advanced transistor elements that comprise strain-inducing semiconductor alloys and gate structures of increased capacitance including a high-k gate dielectric of increased permittivity.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout. In a wide variety of circuits, field effect transistors represent one important type of circuit element that substantially determines performance of the integrated circuits. Generally, a plurality of process technologies are currently practiced for forming field effect transistors, wherein, for many types of complex circuitry, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith the reduction of channel resistivity, which in turn causes an increase of gate resistivity due to the reduced dimensions, is a dominant design criterion for accomplishing an increase in the operating speed of the integrated circuits.

Presently, the vast majority of integrated circuits are based on silicon due to substantially unlimited availability, the well-understood characteristics of silicon and related materials and processes and the experience gathered during the last 50 years. Therefore, silicon will likely remain the material of choice for future circuit generations designed for mass products. One reason for the dominant role of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes as are required, for example, during anneal cycles to activate dopants and to cure crystal damage without sacrificing the electrical characteristics of the interface.

For the reasons pointed out above, in field effect transistors, silicon dioxide is preferably used as a gate insulation layer that separates the gate electrode, frequently comprised of polysilicon or other metal-containing materials, from the silicon channel region. In steadily improving device performance of field effect transistors, the length of the channel region has continuously been decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a dependence of the threshold voltage on the channel length. Aggressively scaled transistor devices with a relatively low supply voltage and thus reduced threshold voltage may suffer from an exponential increase of the leakage current while also requiring enhanced capacitive coupling of the gate electrode to the channel region. Thus, the thickness of the silicon dioxide layer has to be correspondingly decreased to provide the required capacitance between the gate and the channel region. For example, a channel length of approximately 80 nm may require a gate dielectric made of silicon dioxide as thin as approximately 1.2 nm. Although usage of high speed transistor elements having an extremely short channel may be restricted to high speed signal paths, whereas transistor elements with a longer channel may be used for less critical applications, such as storage transistor elements, the relatively high leakage current caused by direct tunneling of charge carriers through an ultra-thin silicon dioxide gate insulation layer may reach values for an oxide thickness in the range or 1-2 nm that may not be compatible with requirements for performance driven circuits, even if only transistors in speed critical paths are formed on the basis of an extremely thin gate oxide.

Therefore, replacing silicon dioxide as the material for gate insulation layers has been considered, particularly for extremely thin silicon dioxide gate layers. Possible alternative materials include materials that exhibit a significantly higher permittivity so that a physically greater thickness of a correspondingly formed gate insulation layer provides a capacitive coupling that would be obtained by an extremely thin silicon dioxide layer. Commonly, a thickness required for achieving a specified capacitive coupling with silicon dioxide is referred to as capacitance equivalent thickness (CET). Thus, at a first glance, it appears that simply replacing the silicon dioxide with high-k materials is a straightforward way to obtain a capacitance equivalent thickness in the range of 1 nm and less.

It has thus been suggested to replace silicon dioxide with high permittivity materials such as tantalum oxide ($Ta_2O_5$), with a k of approximately 25, strontium titanium oxide (SrTiO$_3$), having a k of approximately 150, hafnium oxide (HfO$_2$), HfSiO, zirconium oxide (ZrO$_2$), and the like.

Additionally, transistor performance may be increased by providing an appropriate conductive material for the gate electrode to replace the usually used polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides an increased capacitance based on the same thickness as a silicon dioxide layer, while additionally maintaining leakage currents at an acceptable level. On the other hand, the non-polysilicon material, such as titanium nitride and the like, may be formed so as to connect to the high-k dielectric material, thereby substantially avoiding the presence of a depletion zone.

After forming sophisticated gate structures including a high-k dielectric and a metal-based gate material, however, high temperature treatments may be required, which may result in a shift of the work function and a reduction of the permittivity of the gate dielectric, which may also be associated with an increase of layer thickness, thereby offsetting many of the advantages of the high-k dielectric in combination with the metal material. It is believed that the deterioration of the high-k metal gate is substantially caused by the incorporation of oxygen and a respective oxygen diffusion within the high-k dielectric material, wherein the oxygen diffusion may be fed by oxygen contained in the ambient that may come into contact with the high-k dielectric during the processing of the devices. Since, for instance, hafnium- and zirconium-based oxides grow very fast due to the high affinity to oxygen diffusion even at moderately high temperatures, a significant modification of the characteristics of the high-k dielectric material may be observed, for instance an increased layer thickness and thus a reduced dielectric constant, which may even further be pronounced at moderately high temperatures of approximately 950-1300° C. as may typically be used during activation treatments and the like.

In addition to a significant modification of the high-k dielectric material, also the work function of the metal in the gate stack may be shifted towards the center of the band gap, thereby modifying the threshold voltage of respective transistors. Due to the high oxygen affinity of the high-k dielectric material, the gate stack is usually encapsulated after the patterning process in order to avoid or at least significantly reduce any contact of oxygen contained in the process ambience and the like to enhance stability of the high-k dielectric material and the respective metals in the gate stack. For this purpose, silicon nitride has proven to be a promising material due to its oxygen blocking characteristics. Hence, in typical conventional process flows, a silicon nitride liner with a thickness in the range of approximately 1-5 nm may be formed on exposed surface areas of the patterned high-k gate stack, wherein appropriate deposition techniques are used so as to not unduly affect device characteristics and/or the subsequent manufacturing steps. For example, well-established low pressure chemical vapor deposition (LPCVD) techniques may be applied for forming the silicon nitride liner.

In addition to providing sophisticated gate electrode structures by using high-k dielectric materials and metal-containing gate electrode materials, other approaches have been developed in order to enhance transistor performance for a given gate length and a thickness of a gate dielectric material. For example, by creating a certain strain component in the channel region of the transistor elements, the charge-carrier mobility and thus the overall conductivity of the channel may be enhanced. For a silicon material having a standard crystallographic configuration, i.e., a (100) surface orientation with the channel length direction oriented along a (110) equivalent direction, the creation of a tensile strain component in the current flow direction may enhance conductivity of electrons, thereby improving transistor performance of N-channel transistors. On the other hand, generating a compressive strain component in the current flow direction may increase hole mobility and thus provide superior conductivity in P-channel transistors. Consequently, a plurality of strain-inducing mechanisms have been developed in the past which may per se require a complex manufacturing sequence for implementing the various strain-inducing techniques. For example, one promising approach that is frequently applied is the incorporation of a compressive strain-inducing semiconductor alloy in the drain and source areas of P-channel transistors. For this purpose, in an early manufacturing stage, cavities are selectively formed adjacent to the gate electrode structure of the P-channel transistor, while the N-channel transistors are covered by a spacer layer. Additionally, the gate electrode of the P-channel transistor has to be encapsulated in order to not unduly expose the gate electrode material to the etch ambient for forming the cavities and also for providing an efficient growth mask during the selective epitaxial growth process, in which a desired semiconductor alloy may be grown on a crystalline substrate material, while a significant deposition of material on dielectric surface areas may be suppressed by appropriately selecting the corresponding process parameters. After forming the strain-inducing semiconductor alloy, the corresponding spacer structure and a cap layer encapsulating the gate electrode of the P-channel transistor may be removed along with the spacer layer that covers the N-channel transistors. Thereafter, the further processing may be continued by forming drain and source regions so as to complete the basic transistor configuration.

A corresponding strain-inducing mechanism is a very efficient concept for improving transistor performance and thus a combination with sophisticated gate electrode structures on the basis of high-k dielectric materials and metal gate electrodes is highly desirable. However, it turns out that the combination of both complex process sequences may cause integrity issues with respect to the sensitive high-k dielectric material, since the corresponding protection liner may be unduly exposed to reactive etch ambient, as will be described in more detail with reference to FIGS. 1*a*-1*f*.

Figure 1A:
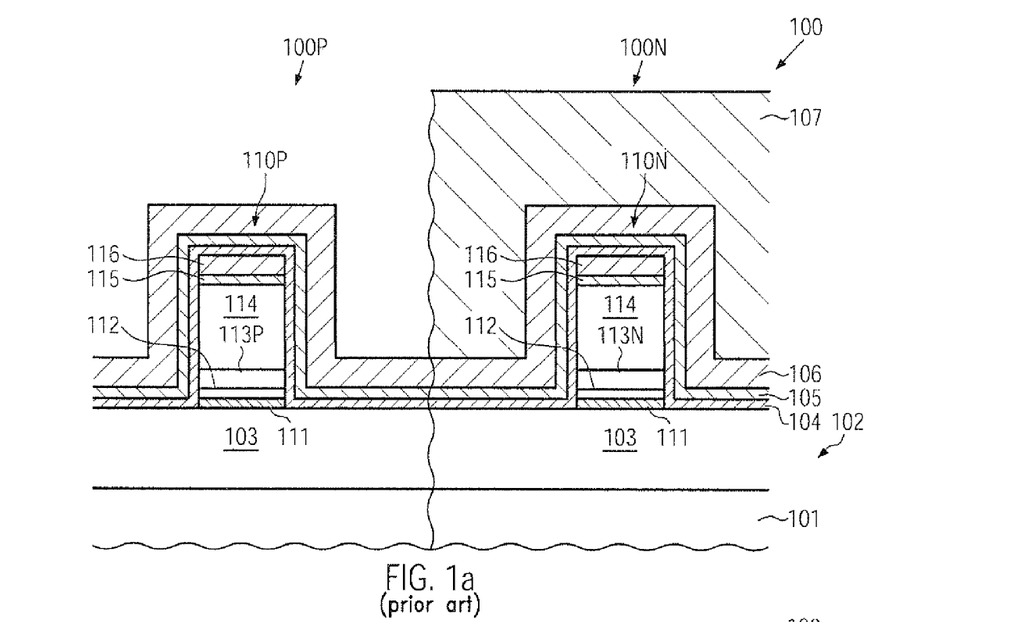
FIGS. 1a-1f schematically illustrate cross-sectional views of a sophisticated semiconductor device during various manufacturing stages of a conventional process sequence for forming a gate stack and a strain-inducing semiconductor alloy.

FIG. 1*a* schematically illustrates a cross-sectional view of a semiconductor device 100 comprising a substrate 101, such as a silicon substrate, an insulating carrier material and the like, above which is formed a silicon-based semiconductor layer 102. In and above the semiconductor layer 102, sophisticated transistor elements 100P, 100N are to be formed on the basis of a strain-inducing mechanism and on the basis of a sophisticated gate electrode structure. In the manufacturing stage shown in FIG. 1*a*, the transistors 100P, 100N comprise a first gate stack 110P and a second gate stack 110N, respectively, which both may have incorporated a high-k gate dielectric material in combination with an appropriately selected metal-containing electrode material. For example, the gate stacks 110P, 110N may both comprise a basic oxide material 111 of reduced thickness, for instance with a thickness of approximately 1 nm or less, to provide a well-established interface with corresponding channel regions 103 located below the corresponding gate stacks 110P, 110N. Moreover, a high-k dielectric material, such as one of the materials specified above, for instance in the form of hafnium oxide, is formed on the basic oxide layer 111, as indicated by 112. For example, a thickness of the high-k dielectric material 112 may range from 1-2 nm, when hafnium oxide is used. Furthermore, the first gate stack 110P comprises a metal-containing electrode material 113P, the work function of which may be appropriately adjusted so as to obtain a desired threshold voltage for the P-channel transistor 100P. Similarly, the gate stack 110N has formed on the high-k dielectric material 112 an appropriately selected gate electrode material 113N with a required work function to comply with the device requirements of the transistor 100N. For example, the materials 113P, 113N may be provided on the basis of a titanium nitride material, wherein an additional material composition or a corresponding adaptation of the material characteristics may be performed in one of the gate stacks 110P, 110N. Furthermore, an additional gate electrode material 114, for instance in the form of polysilicon, is typically provided in order to obtain a desired height of the gate stacks 110P, 110N, for instance with respect to the further processing, when corresponding drain and source regions are to be formed on the basis of implantation processes, in which a certain degree of ion-blocking effect of the gate stacks is required for protecting the channel regions 103. Furthermore, a liner material 115 followed by a cap layer 116 is formed above the material 114. The liner material 115 is typically comprised of silicon dioxide, while the cap layer 116 is formed of silicon nitride. As previously explained, in view of enhanced integrity of the sensitive high-k dielectric material 112 and the electrode materials 113P, 113N, which have to be stabilized during the further processing in view of any threshold voltage variabilities, a protection liner 104 comprised of silicon nitride is formed in particular on sidewalls of the gate stacks 110P, 110N. Additionally, an etch stop liner 105, comprised of silicon dioxide, and a spacer layer 106 are formed above the transistors 100P, 100N. In the manufacturing stage shown, an etch mask 107 is provided to cover the transistor 100N, above which the spacer layer 106 is to be maintained during a subsequent patterning sequence for forming cavities in the transistor 100P.

The semiconductor device 100 is typically formed on the basis of the following process. After forming respective isolation structures (not shown) and defining an appropriate basic dopant profile in the semiconductor layer 102 as is required for the different transistors 100P, 100N, the gate stacks 110P, 110N may be formed. To this end, the basic oxide layer 111 is typically formed by using sophisticated oxidation processes, followed by the deposition of the high-k dielectric material 112. Thereafter, a corresponding process sequence is applied in which the materials 113P, 113N are selectively provided in accordance with the corresponding work functions in view of adjusting the threshold voltage of the corresponding transistors 100P, 100N. For instance, an appropriate first metal-containing material may be deposited and may be removed from above one of the transistors, such as transistor 100P, followed by the deposition of a further material having appropriate electronic characteristics for the transistor 100P. Next, the polysilicon material may be deposited, for instance in combination with materials 115 and 116, which are subsequently patterned by using sophisticated lithography and etch techniques. Next, the silicon nitride liner 104 is formed with a thickness of approximately 1-5 nm by using sophisticated deposition techniques, such as atomic layer deposition (ALD), thermally activated chemical vapor deposition (CVD) and the like, as is also previously described. Thereafter, the silicon dioxide liner 105 is deposited, followed by the deposition of the spacer material 106. Finally, the etch mask 107 is provided by using well-established lithography techniques.

Figure 1B:
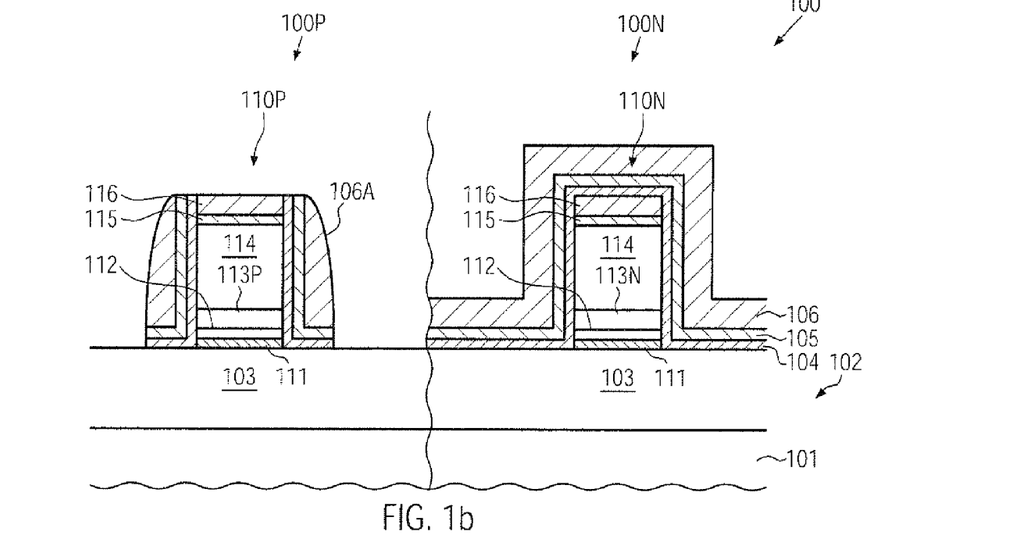

FIG. 1b schematically illustrates the semiconductor device 100 in a further advanced manufacturing stage, in which the spacer layer 106 is patterned into a corresponding spacer element 106A, which may be accomplished by using well-established anisotropic etch techniques, in which silicon nitride material is etched selectively to silicon dioxide material. Thereafter, exposed portions of the liner 105 and of the liner 104 are removed by additional etch steps. Furthermore, the mask 107 (FIG. 1a) is removed prior to or after a corresponding etch process for forming cavities in the exposed portion of the semiconductor layer 102 of the transistor 100P. After forming the corresponding cavities, exposed portions of the device 100 are prepared for a subsequent selective epitaxial growth process, requiring corresponding wet chemical cleaning processes. Thereafter, an appropriate semiconductor alloy may be deposited selectively within the previously-formed cavities using well-established deposition recipes.

Figure 1C:
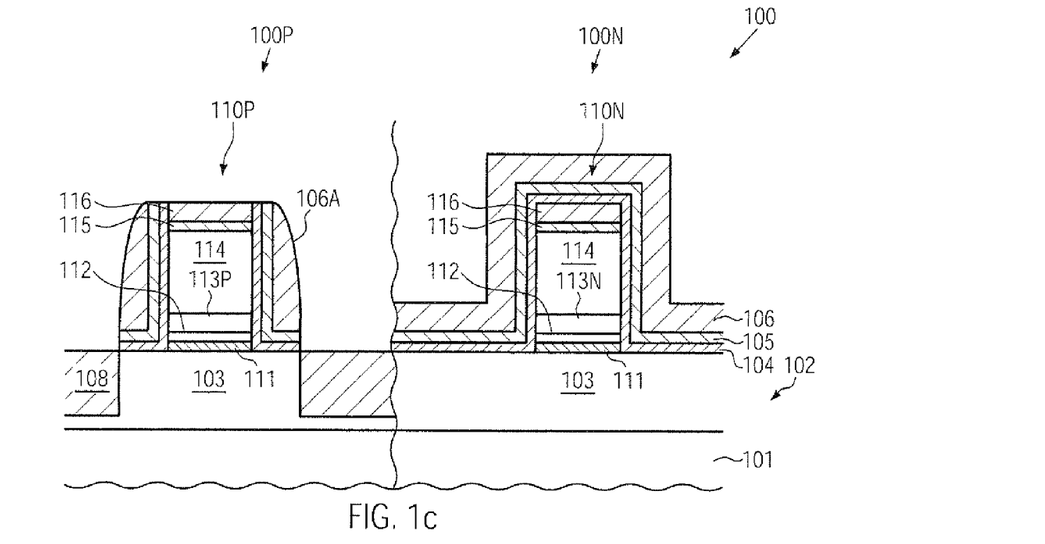

FIG. 1c schematically illustrates the semiconductor device 100 after the epitaxial growth process. Hence, a semiconductor alloy 108, for instance in the form a silicon/germanium mixture, is formed in the semiconductor layer 102 laterally adjacent to the gate stack 110P and offset therefrom by the spacer 106A.

Figure 1D:
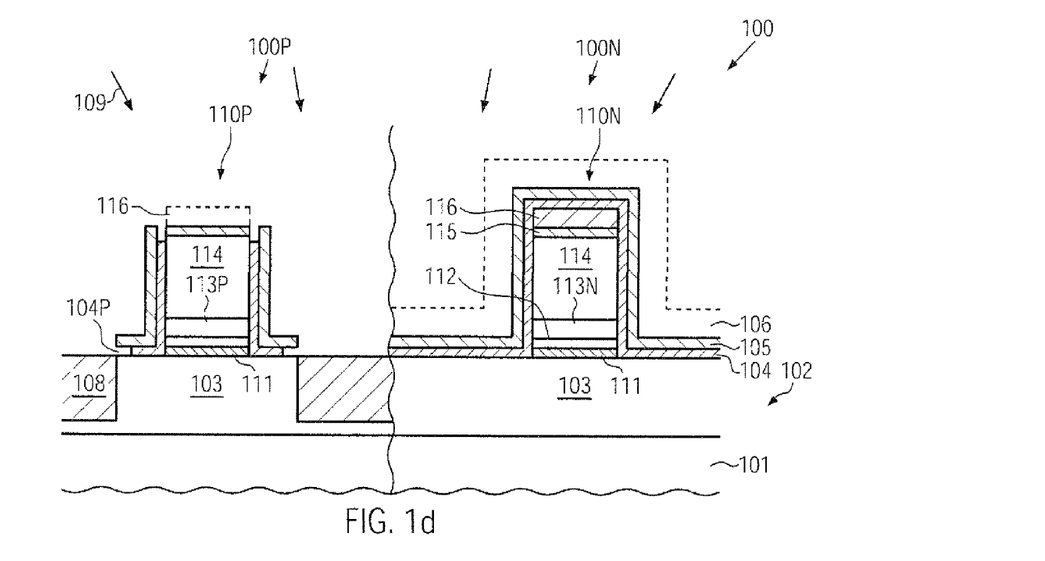

FIG. 1d schematically illustrates the device 100 during an etch process 109 that is typically performed on the basis of hot phosphoric acid in order to remove the cap layer 116 of the gate stack 110P and also the spacer layer 106 formed above the transistor 100N. Hot phosphoric acid is a well-established chemical agent for removing silicon nitride selectively to silicon dioxide and silicon material. During the etch process 109, a certain consumption of the liner 104 may occur in the transistor 100P, as indicated by 104P, wherein, however, reliable coverage of the sidewall portions of the gate stack 110P may be maintained. On the other hand, the spacer layer 106 is removed, wherein the liner material 105 reliably covers the liner 104, however, also reliably covers the cap layer 116 of the gate stack 110N. Consequently, a further masked etch process is performed in order to remove the cap layer 116 of the stack 110N.

Figure 1E:
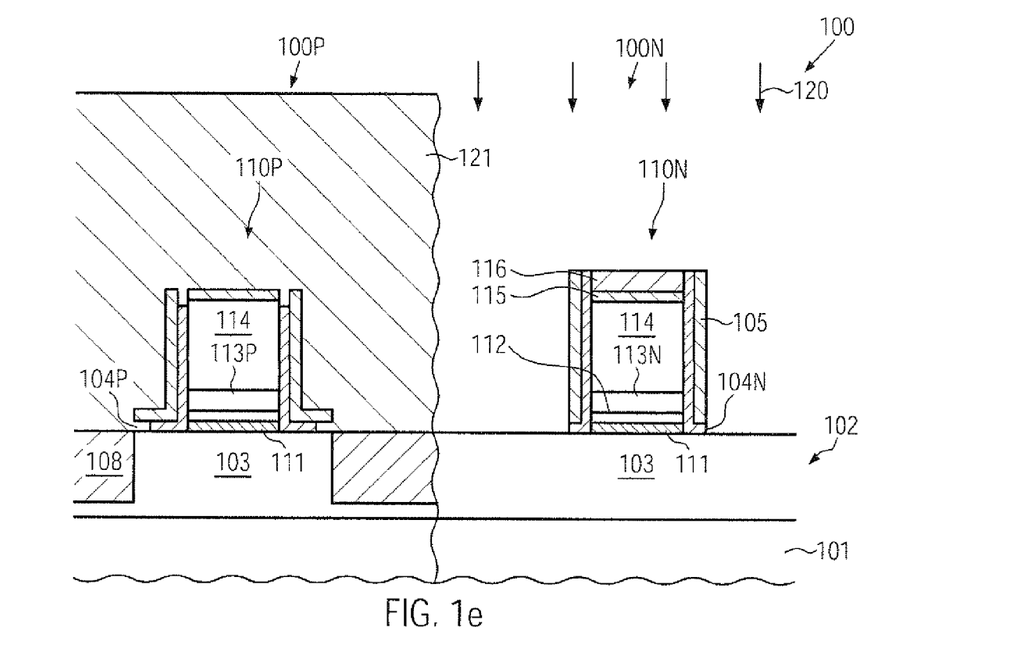

FIG. 1e schematically illustrates the semiconductor device 100 with an etch mask 121 covering the transistor 100P while exposing the transistor 100N to an etch ambient 120, which may be established on the basis of plasma-assisted etch chemistry in order to remove exposed portions of the liners 104N, 105 from horizontal device areas, thereby exposing the cap layer 116 of the gate stack 110N. Consequently, during the etch process 120, liner 105 may be substantially maintained at sidewalls of the gate stack 110N, since exposure to the etch ambient 120 may be restricted to a moderately short etch time, since the initial thickness of the liners 104, 105 is moderately small. Furthermore, by restricting the etch time of process 120, undue material erosion of the exposed portion of the semiconductor layer 102 in the transistor 100N may be maintained at an acceptable level. Thereafter, the etch mask 121 is removed or may be maintained during a further etch process for removing the cap layer 116 of the stack 110N.

Figure 1F:
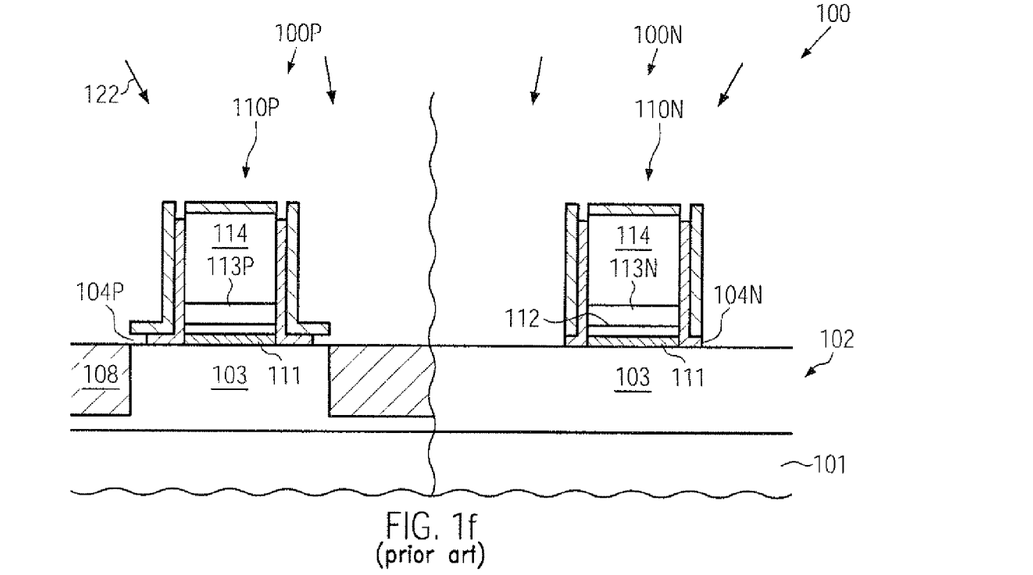

FIG. 1f schematically illustrates the semiconductor device 100 wherein a corresponding etch process 122, may be performed on the basis of hot phosphoric acid due to the enhanced selectivity with respect to silicon dioxide and silicon, as already previously discussed. However, during the etch process 122, exposed portions of the liner 104N may further be attacked and thus removed, thereby possibly exposing the sensitive high-k dielectric material 112 in the gate stack 110N. That is, due to the sequence of etch processes 120, 122, undue consumption of the liner 104N may occur, which may thus result in reduced integrity of gate stack 110N, while a corresponding undue exposure of sensitive materials in the gate stack 110P may be less critical, even if exposed to the etch ambient 122, since the corresponding liner material 104P may have an increased lateral extension at the bottom of the gate stack 110P.

As a consequence, during the further processing, i.e., forming drain and source regions on the basis of an appropriately-designed spacer structure and performing corresponding high temperature processes, integrity of the lower portion of the gate stack 110N may not be guaranteed, which may result in a significant threshold viability after finalizing the transistor 100N. Consequently, although advanced process techniques are used, for instance by incorporating the strain-inducing semiconductor alloy 108 for the transistor 100P and implementing a sophisticated gate electrode structure, the finally-obtained gain in performance may be less due to a corresponding threshold variation, in particular of the N-channel transistor 100N.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides techniques in which enhanced integrity of sophisticated gate electrode structures may be achieved during a complex manufacturing sequence, during which strain-inducing semiconductor alloys may be incorporated at least in one type of transistor. For this purpose, integrity of a protection liner may be enhanced by appropriately covering at least the bottom of the gate stack during critical etch processes, in which a respective cap material of the gate stack, which may also be referred to as "gate head," are to be removed. In some illustrative aspects disclosed herein, an appropriate mask material may be deposited and may be processed so as to expose an upper portion of the gate stacks, while reliably covering the bottom of the gate stacks during the critical etch processes. Consequently, integrity of the gate stacks may be accomplished, while not unduly contributing to overall process complexity.

One illustrative method disclosed herein comprises forming a protection liner on sidewalls of a first gate stack and a second gate stack, which are formed on a semiconductor layer and comprise a high-k dielectric material. The method further comprises forming a semiconductor alloy in the semiconductor layer laterally offset from the first gate stack on the basis of a spacer structure comprising a spacer element and an etch stop liner, while the second gate stack is covered by an etch stop layer and a spacer layer. Additionally, the method comprises removing a first cap layer of the first gate stack and the spacer layer covering the second gate stack by performing an etch process. Moreover, an etch mask is formed to cover a bottom portion and expose a top portion of the first and second gate stacks. Finally, the method comprises removing a second cap layer of the second gate stack in the presence of the etch mask.

A further illustrative method disclosed herein relates to forming a gate electrode structure of a transistor. The method comprises forming a protection liner on sidewalls of a gate stack that is formed above a semiconductor layer and comprises a high-k dielectric gate insulation layer, a metal-containing electrode material formed on the high-k dielectric gate insulation layer and a cap layer. Additionally, the method comprises forming a mask material above the semiconductor layer to cover the protection liner at least at a bottom of the gate stack. Finally, the method comprises removing the cap layer in the presence of the mask material.

A still further illustrative method disclosed herein comprises forming a mask material laterally adjacent to a first gate stack of a first transistor and a second gate stack of a second transistor, wherein the first and second gate stacks are formed on a semiconductor layer and comprise a high-k dielectric material. The method further comprises removing a first cap layer provided in the first gate stack and/or a second cap layer provided in the second gate stack in the presence of the mask material. Finally, the method comprises forming first drain and source regions of the first transistor and second drain and source regions of the second transistor after removing the first cap layer and the second cap layer.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein provides techniques in which enhanced integrity of a protection liner of sophisticated gate stacks may be achieved by appropriately covering at least the bottom of the corresponding gate stacks during critical etch processes for removing spacer layers, cap layers and the like from a top portion of the gate stacks. Consequently, during a complex manufacturing sequence for providing embedded semiconductor alloys, which may require a sophisticated masking and patterning regime, sensitive high-k dielectric materials and metal-containing gate electrode materials may be protected by a thin liner material since undue exposure thereof to etch ambient, such as hot phosphoric acid, is reduced. For this purpose, in some illustrative embodiments, a mask material may be deposited, for instance in the form of organic material, such as a polymer material, a resist material and the like, so that a substantially planar surface topography may be obtained, which may then be exposed to an etch ambient for reducing the thickness of the mask material. Consequently, the top portion or head of the gate stacks may be exposed so as to enable reliable removal of any cap or spacer materials, while at the same time undue exposure of the liner material at the bottom of the gate stacks may be avoided. The deposition of the mask material may be performed at an appropriate manufacturing stage, that is, at least prior to removing the cap material of a transistor that may have not received a semiconductor alloy, while, in other cases, the mask material may be provided in an earlier manufacturing stage. Consequently, by depositing the mask material in a low viscous state, a sufficiently planar surface topography may be obtained, which may, in some cases, be used for further processing. In other cases, an additional planarization process may be performed in order to obtain a desired degree of surface planarity, while also removing an unwanted portion of the mask material. For example, in some illustrative embodiments, the planarization may include a polishing process, during which at least a top surface of the gate stack may be exposed, so that the corresponding exposed surface areas are available for applying an appropriate etch chemistry in order to remove at least some of unwanted material portions of the gate stacks. In still other illustrative embodiments, a portion of the gate stack may be removed during the planarization process together with the mask material, which may provide the mechanical integrity of the gate stacks during the planarization process and which may also provide integrity of the bottom portion of the gate stacks, if additional etch processes are to be applied in order to remove undesired materials, such as cap layers, spacer layers and the like.

With reference to FIGS. 2a-2l, further illustrative embodiments will now be described in more detail, wherein reference may also be made to FIGS. 1a-1f when appropriate.

Figure 2A:
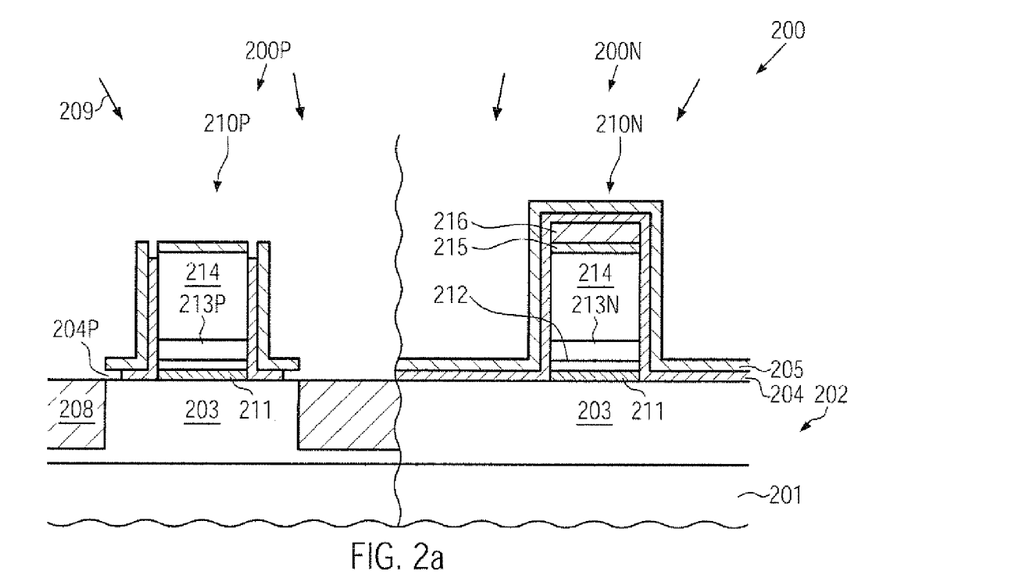
FIGS. 2a-2f schematically illustrate cross-sectional views of a semiconductor device during various manufacturing stages in forming transistors of different types on the basis of a sophisticated gate electrode structure and an incorporated semiconductor alloy according to illustrative embodiments, wherein enhanced integrity of a protection liner may be ensured.

FIG. 2a schematically illustrates a cross-sectional view of a semiconductor device 200 comprising a first transistor 200P and a second transistor 200N in an early manufacturing stage. As illustrated, the device 200 may comprise a substrate 201 and a semiconductor layer 202, such as a silicon-based semiconductor material, in and above which are formed the transistors 200P, 200N. It should be appreciated that the substrate 201 may represent any appropriate carrier material for forming thereabove the semiconductor layer 202. For instance, an insulating material, for instance in the form of a buried insulating layer (not shown) may be provided, at least partially above the substrate 201, in order to provide a semiconductor-on-insulator (SOI) configuration. Furthermore, appropriate isolation structures (not shown) may be provided in the semiconductor layer 202 in order to define corresponding "active" regions, in which appropriate dopant profiles are to be provided for, for instance, the transistors 200P, 200N. Furthermore, in the manufacturing stage shown, the transistors 200P, 200N may comprise corresponding gate stacks 210P, 210N, respectively, which may have a similar configuration as previously described with reference to the semiconductor device 100. For example, the semiconductor device 200 as shown in FIG. 2a may have a similar configuration as is described with reference to the device 100 as illustrated in FIG. 1d. Thus, the gate stacks 210P, 210N may comprise a high-k dielectric material 212, possibly in combination with a base material 211, for instance provided in the form of a silicon dioxide material and the like. It should be appreciated, however, that, if compatible with the overall process and device requirements, the base layer 211 may be omitted. For example, the high-k dielectric material may be provided in the form of any of the above-specified high-k dielectric materials with an appropriate thickness in order to obtain the desired degree of capacitive coupling between the gate stacks 210N, 210P and a corresponding channel region 203. Furthermore, appropriate metal-containing electrode materials 213P, 213N may be provided so as to be directly in contact with the high-k dielectric material 212, wherein, as previously explained, the materials 213P, 213N may have an appropriate composition so as to comply with overall transistor requirements, for instance in view of threshold voltage. That is, corresponding work functions of the materials 213P, 213N may be appropriately adapted, at least at a portion that is in direct contact with the high-k material 212, to provide the desired threshold voltage. For example, the transistor 200P may represent a P-channel transistor so that a corresponding work function may result in an energy level which is appropriate for P-channel transistors, while the transistor 200N, when representing an N-channel transistor, may have a corresponding energy level in the vicinity of conduction band. Furthermore, a further material 214, for instance a polysilicon material and the like, may be provided, followed by a liner 215, for instance in the form of silicon dioxide. Furthermore, in the manufacturing stage shown in FIG. 2A, the gate stack 210N may comprise a cap layer 216, for instance comprised of silicon nitride, while a corresponding cap layer may already be removed from the gate stack 210P. Moreover, a protection liner 204 may be formed at least on sidewalls of the gate stacks 210P, 210N and a corresponding etch stop liner 205 may be formed on at least portions of the liner 204. Furthermore, in the manufacturing stage shown, a strain-inducing semiconductor alloy 208 may be provided adjacent to the channel region 203 of the transistor 200P.

The semiconductor device 200 may be formed on the basis of appropriate process techniques for forming the gate stacks 210P, 210N and for incorporating the semiconductor alloy 208. For example, a similar process sequence may be used as previously described with reference to the semiconductor device 100 when referring to FIGS. 1*a*-1*d*. It should be appreciated, however, that other process techniques may be used, as long as integrity of the sensitive materials 212 and the materials 213P, 213N may be ensured by the liner 204. Thus, during the preceding process sequence, a corresponding cap layer may have been removed from the gate stack 210P, as previously described with reference to the device 100, thereby requiring a further etch process for removing the cap layer 216 from the gate stack 210N.

Figure 2B:
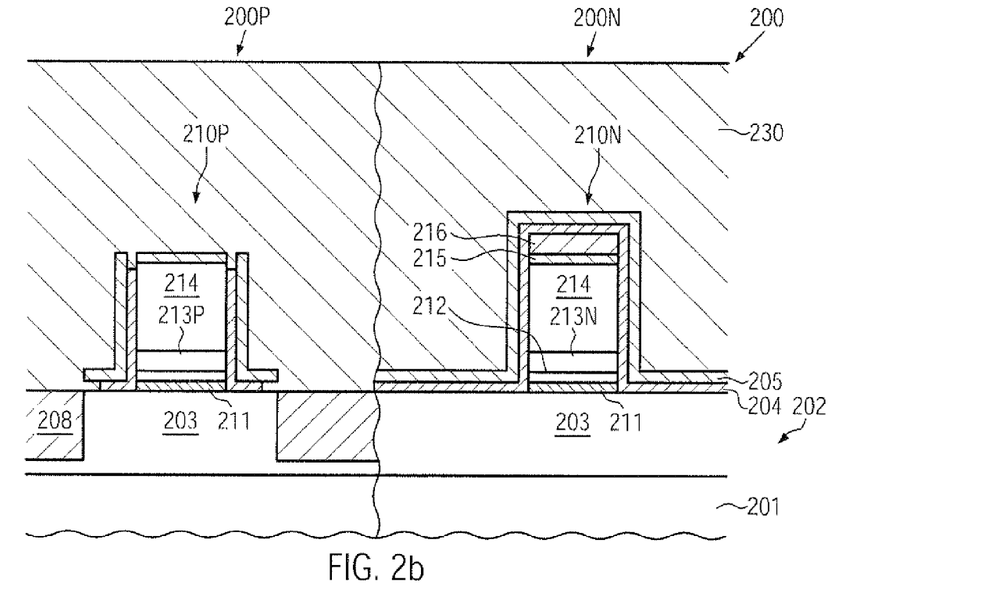

FIG. 2*b* schematically illustrates the semiconductor device 200 in a further advanced manufacturing stage, in which a mask material 230 may be formed to cover the gate stacks 210P, 210N. In one illustrative embodiment, the mask material 230 may be comprised of organic material, which may exhibit a high etch resistance against a plurality of well-established etch recipes. For instance, a plurality of polymer materials are well known in the art which may be applied in a low viscous state, for instance by spin on techniques and the like, and which may, after being cured by heat treatment, radiation and the like, provide the desired etch behavior. In other cases, resist materials may be used for the mask material 230, which may also exhibit a desired etch resistance with respect to a plurality of etch chemistries. During applying the mask material 230 in a low viscous state, a moderately planar surface topography may be accomplished, which may allow a substantially uniform material removal of the mask 230 in a further manufacturing stage. In other illustrative embodiments, an additional planarization process may be applied, for instance in the form of a chemical mechanical polishing (CMP) process, in order to planarize the resulting surface topography. Corresponding embodiments including a planarization process will be described later on in more detail with reference to FIGS. 2*k*-2*l*.

Figure 2C:
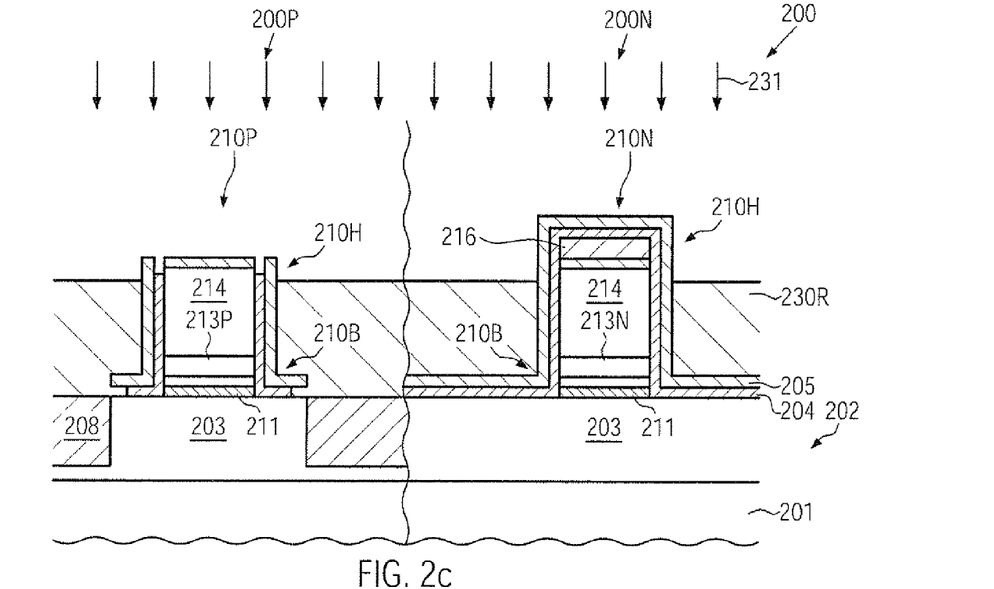

FIG. 2*c* schematically illustrates the semiconductor device 200, in which a portion of the mask material 230 (FIG. 2B) may be removed so as to expose a top portion or head portion 210H of at least the gate stack 210N. For this purpose, the device 200 may be exposed to an etch ambient 231, for instance established on the basis of plasma-assisted etch chemistries, such as oxygen-based plasmas and the like, in which the mask material may be removed with a high degree of selectivity with respect to the gate stack 210N and possibly the gate stack 210P, if the top portion 210H thereof is also exposed. Hence, a reduced mask material 230R, which may also be referred to as an etch mask, may be provided in order to allow an efficient removal of the cap layer 216 of the gate stack 210N in a subsequent manufacturing stage. It should be appreciated that the etch process 231 may also be designed as a wet chemical etch step, as long as a desired high selectivity with respect to any exposed materials of the gate stacks 210P, 210N is ensured. Moreover, a corresponding etch chemistry may be appropriately "diluted" to provide a moderately low removal rate, thereby obtaining a high degree of controllability of the corresponding material removal. Hence, the reduced mask material 230R may be reliably maintained to cover at least a bottom portion of the gate stacks 210P, 210N. It should be appreciated that appropriate etch chemistries may readily be established on the basis of test runs, in which the removal rate for a plurality of polymer materials, resist materials and the like may be determined vis-à-vis a corresponding removal rate for other materials, such as silicon dioxide, silicon nitride and the like.

Figure 2D:
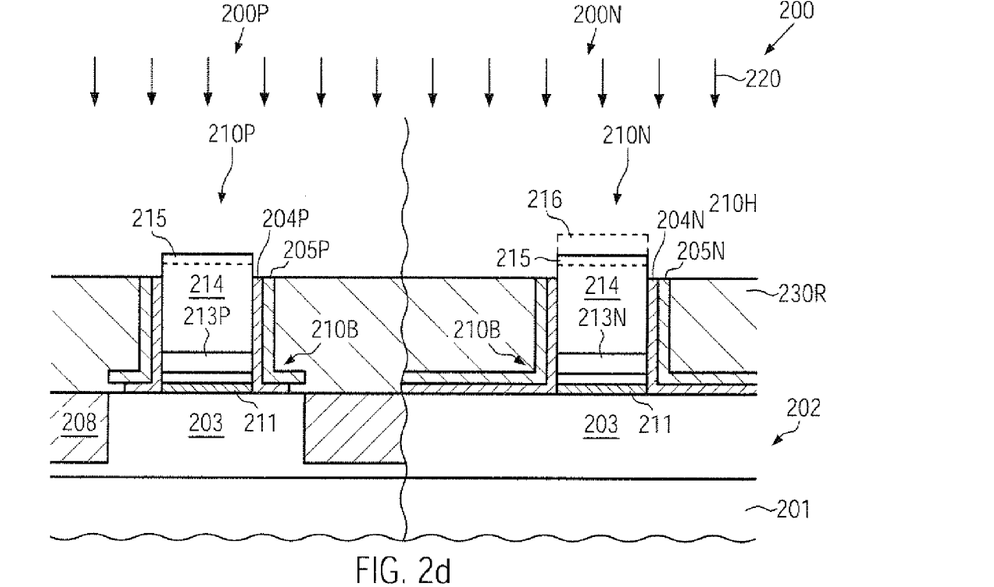

FIG. 2*d* schematically illustrates the semiconductor device 200 in a further advanced manufacturing stage. As illustrated, the liners 204, 205 (FIG. 2C) may be removed, which may be accomplished on the basis of any appropriate etch recipes, as is also previously discussed with reference to the device 100. Furthermore, the semiconductor device 200 may be exposed to an etch ambient 220 that is designed to remove a cap layer 216 from the gate stack 210N, for instance on the basis of hot phosphoric acid and the like. Due to the presence of the reduced mask material or etch mask 230R, undue exposure of corresponding liners 204N, 204P, 205N and 205P at the bottom 210B of the gate stacks 210P, 210N may be reliably suppressed. Furthermore, compared to the conventional strategy, both gate stacks 210P, 210N may be exposed to the corresponding etch sequence including the etch process 220 without negatively affecting the gate stacks and the further processing due to the presence of the mask material 230R. Consequently, a corresponding lithography process as is typically used in the conventional strategy (FIG. 1E) may be omitted, thereby reducing overall process complexity, since typically the corresponding lithography process may be associated with a significantly higher degree of complexity compared to the deposition and patterning of the mask material 230R. Thus, after the efficient removal of the cap layer 216 of the stack 210N, the corresponding liner 215 may be removed, while, in other illustrative embodiments, removal of the liner 215 may be performed after removing the mask material 230R.

Figure 2E:
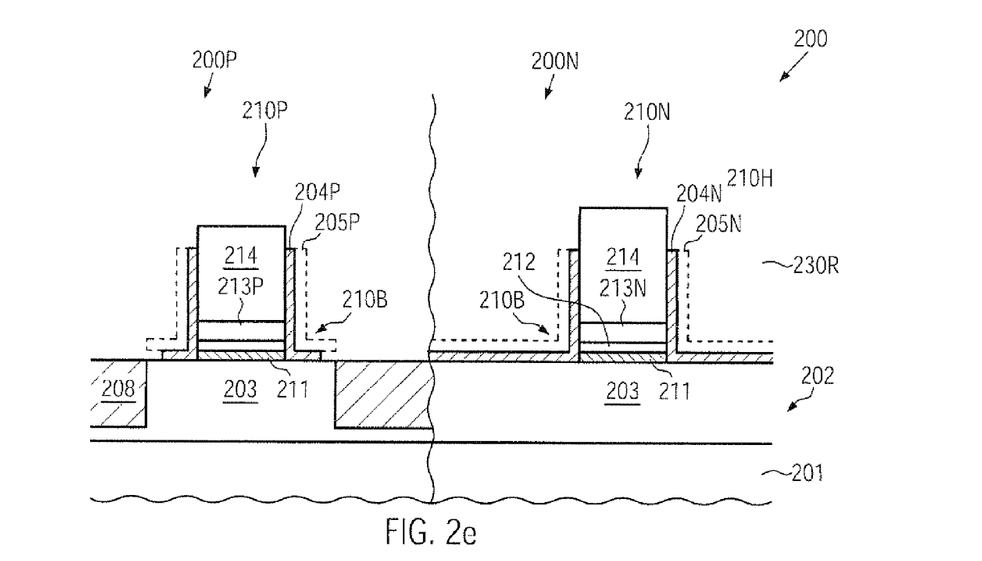

FIG. 2*e* schematically illustrates the semiconductor device 200 in a further advanced manufacturing stage. That is, the mask material 230R has been removed, for instance by well-established wet chemical etch chemistries, for which a plurality of appropriate recipes are available for a large number of resist and polymer materials. In other cases, plasma-assisted etching processes may be used, for which well-established recipes are also available. Thereafter, the remaining liners 205P, 205N may be removed selectively to the protection liners 204P, 204N, for instance by using highly selective etch chemistries, such as hydrofluoric acid and the like, if the liners 205N, 205P are comprised of silicon dioxide. Consequently, the gate stacks 210P, 210N are exposed, except for a reliable coverage by the liners 204P, 204N, so that the further processing may now be continued with enhanced integrity of the liners 204P, 204N, which may also result in an enhanced integrity of the material 212. For example, appropriate implantation processes may be performed in order to incorporate dopant species for defining an appropriate dopant concentration and profile for the transistors 200P, 200N.

Figure 2F:
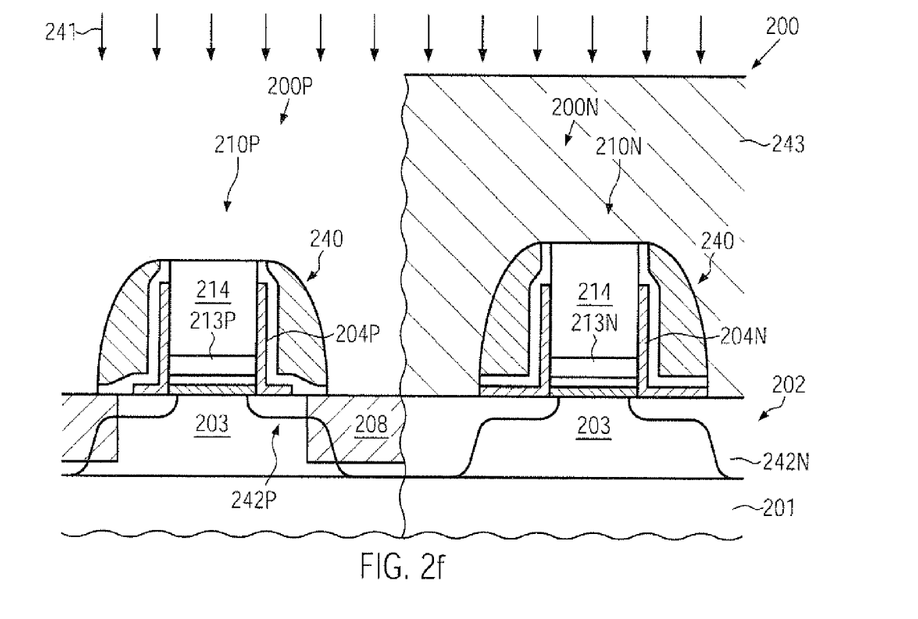

FIG. 2*f* schematically illustrates the device 200 in a further advanced manufacturing stage, in which appropriate sidewall spacer structures 240 may be formed on the gate stacks 210P, 210N to act as an appropriate implantation mask for one or more implantation processes 241. For example, implantation processes 241 may be performed on the basis of an implantation mask 243 that covers the transistor 200N, which may have formed therein substantially completed drain and source regions 242N. On the other hand, respective drain and source regions 242P may be formed during the implantation process 241, wherein, as previously explained, the gate stacks 210P, 210N may provide the desired ion-blocking effect in order to avoid undue dopant penetration of the channel regions 203. As illustrated, corresponding manufacturing processes for providing the spacer structure 240 may be accomplished with a desired integrity of the liners 204N, 204P, thereby also maintaining integrity of the sensitive high-k dielectric materials in the gate stacks 210P, 210N. After forming the drain and source regions 242P, 242N, the further processing may be continued as is required by the overall strategy. For example, corresponding anneal processes may typically be performed and, if required, the height of the gate stacks 210P, 210N may be reduced and/or a corresponding metal silicide material may be formed therein and the like.

With reference to FIGS. 2g-2j, further illustrative embodiments will now be described, in which the mask material may be provided at an early manufacturing stage.

Figure 2G:
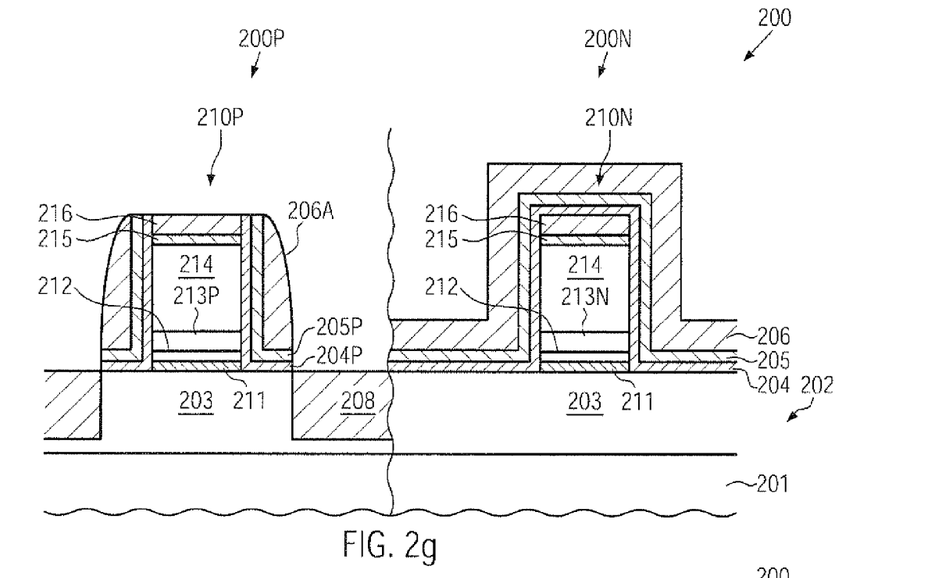
FIGS. 2g-2j schematically illustrate cross-sectional views of the semiconductor device during various manufacturing stages according to still further illustrative embodiments, in which enhanced liner integrity may be guaranteed by providing an appropriate mask material to cover the bottom of the corresponding gate stacks.

FIG. 2g schematically illustrates the semiconductor device 200 in a manufacturing stage that substantially corresponds to a stage as previously described with reference to FIG. 1C. That is, the strain-inducing semiconductor alloy 208 may have been formed in the transistor 200P on the basis of the spacer element 206A, while the transistor 200N is still covered by the spacer layer 206. Furthermore, due to the preceding formation of the semiconductor alloy 208, the lateral extensions of the liners 204P, 205P are substantially determined by the width of the spacer element 206A.

Figure 2H:
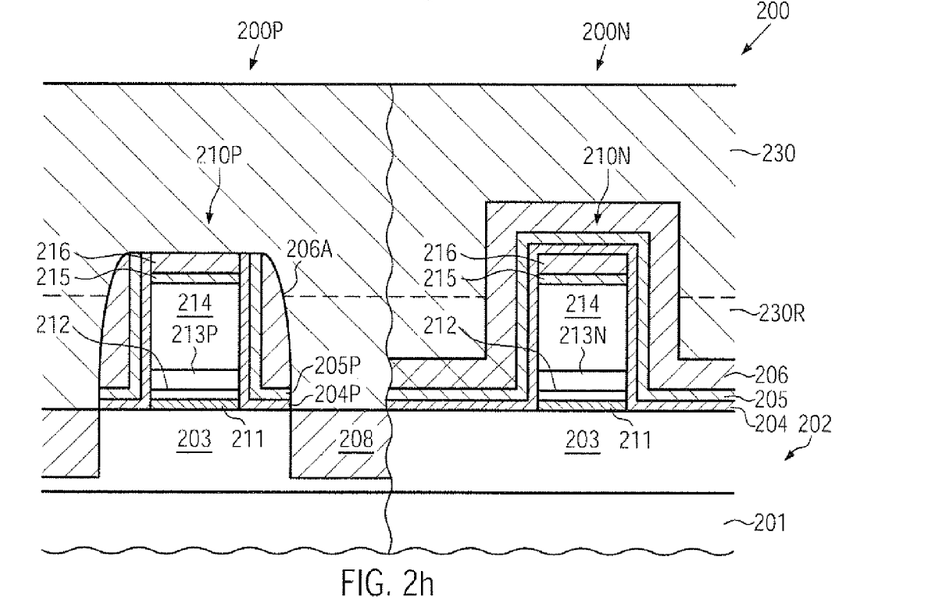

FIG. 2h schematically illustrates the device 200 after the deposition of the mask material 230, thereby covering the transistors 200P, 200N. With respect to any appropriate material composition of the mask material 230, the same criteria may apply as previously explained. Moreover, in some illustrative embodiments, a corresponding etch process may be performed to reduce the thickness of the layer 230 in order to provide a reduced mask material 230R, as indicated by the dashed line. For this purpose, any appropriate etch technique may be used, for instance the etch process 231 (FIG. 2c).

Figure 2I:
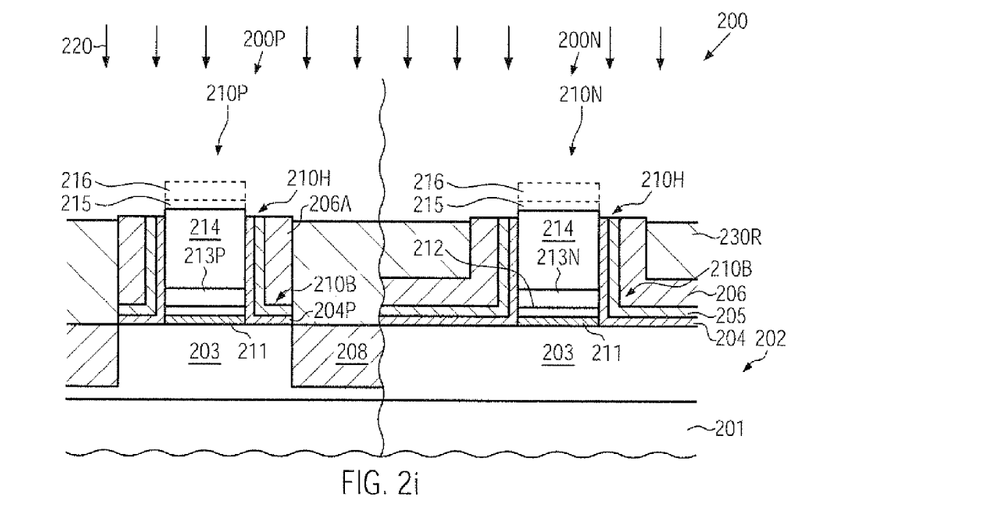

FIG. 2i schematically illustrates the device 200 in a further advanced manufacturing stage. As illustrated, the top portion 210H of the gate stacks 210P, 210N may be exposed by the reduced material 230R and an appropriate etch sequence 220 may be performed to remove the cap layers 216 and the liners 215. On the other hand, the bottom portions 210B are reliably covered by the mask material 230R in the transistor 200P, while, in the transistor 200N, additionally the spacer layer 206 may be present. Hence, the lateral extension of the liner 204P in the transistor 200P may be maintained during the etch sequence 220, which may provide a sufficient process margin in a later manufacturing stage, when the residuals of the spacer 206A and the spacer layer 206 are to be removed.

Figure 2J:
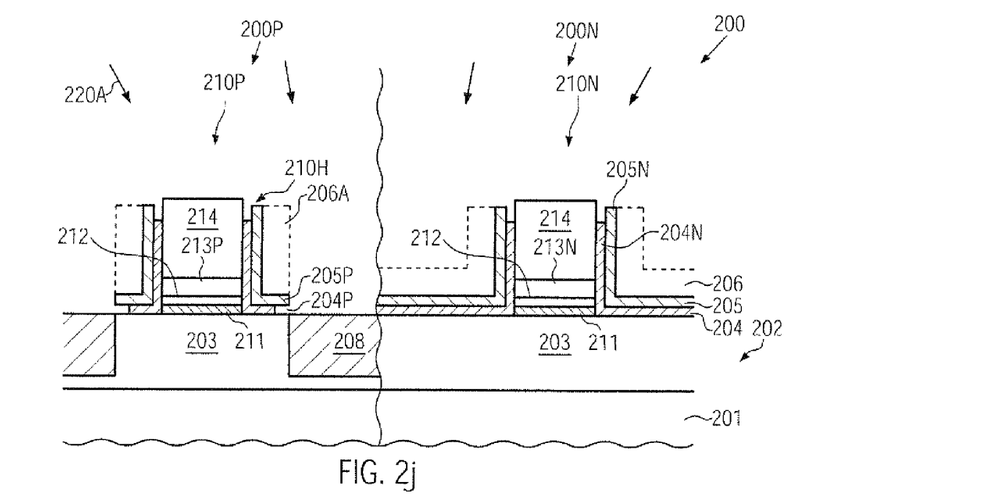

FIG. 2j schematically illustrates the semiconductor device 200 after the removal of the mask material 230R (FIG. 2I) and during the exposure to a further etch ambient 220A, which is designed to remove the spacer 206A and the spacer layer 206 selectively to silicon and silicon dioxide material. For example, the process 220A may be performed on the basis of hot phosphoric acid. During the etch process 220A, a portion of the liners 204P, 204N may be removed, however, without exposing the sensitive materials 212, in particular in the gate stack 210P. Consequently, integrity of the gate stacks 210P, 210N may be maintained, and the remaining portions of the liners 204P, 204N may provide enhanced integrity during the further processing. Thereafter, the remaining liners 205P, 205N may be removed, similarly as is described with reference to FIG. 2e, and the further processing may be continued as is previously described, thereby also ensuring enhanced integrity of the gate stacks 210P, 210N during the completion of the basic transistor configurations.

Figure 2K:
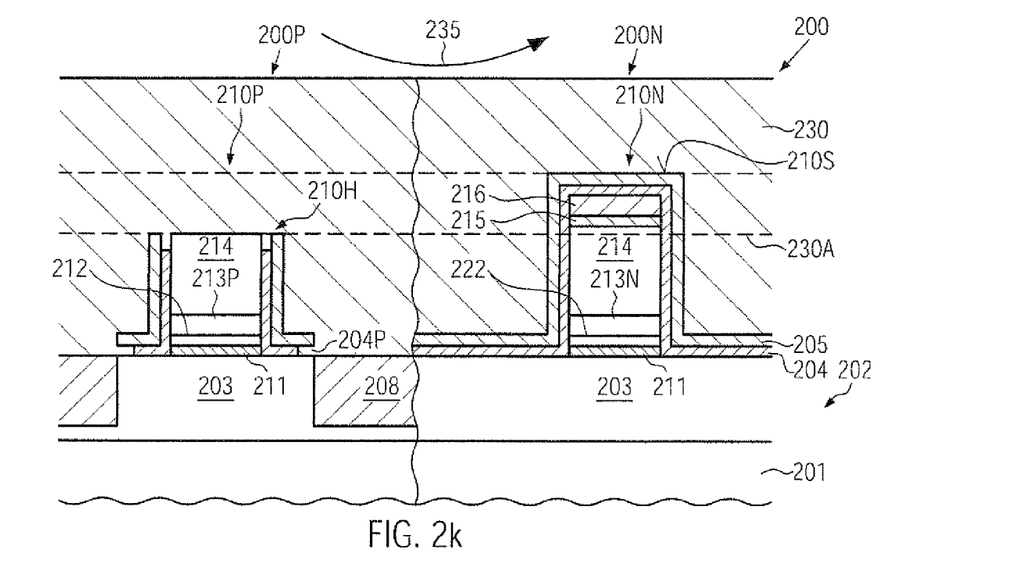
FIGS. 2k-2l schematically illustrate cross-sectional views of the semiconductor device according to still further illustrative embodiments, in which enhanced liner integrity may be accomplished by using a mask material and an appropriately designed planarization technique.
Figure 2L:
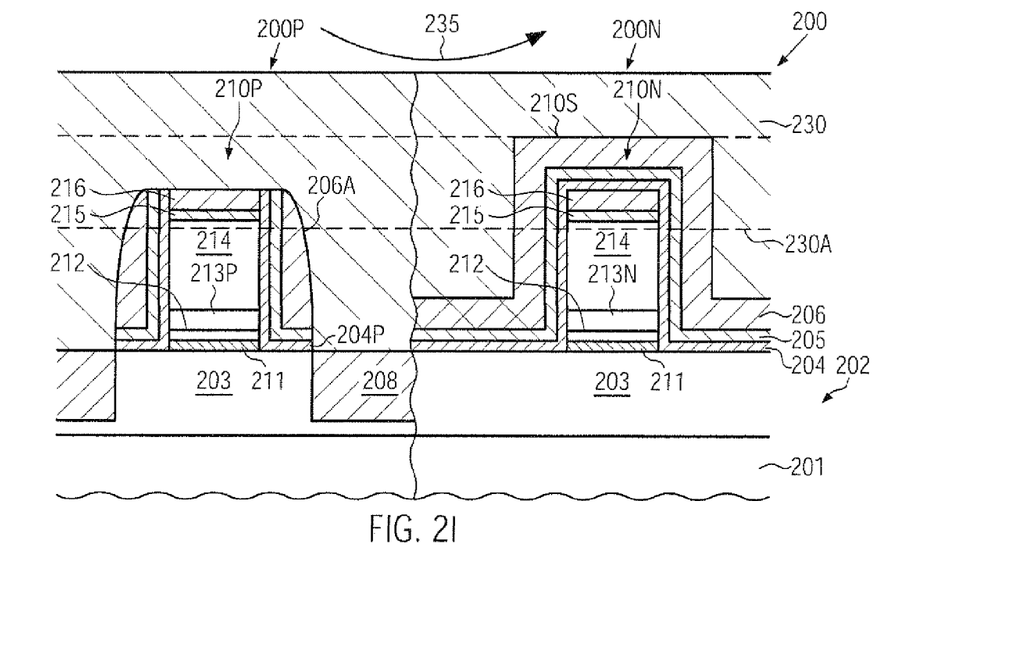

With reference to FIGS. 2k-2l, further illustrative embodiments will now be described in which, in addition to or alternatively to removing a portion of the mask material by etch techniques, a planarization process may be applied.

FIG. 2k schematically illustrates the semiconductor device 200 at a manufacturing stage which may substantially correspond to the configuration of the device 200 as described with reference to FIG. 2b. Hence, the mask material 230 may be formed above the transistors 200P, 200N so as to cover both gate stacks 210P, 210N. In the embodiment shown, a planarization process 235 may be used to enhance the overall surface topography, which may result in superior process control upon removing a portion of the material 230. For this purpose, a corresponding etch process may be used, as previously described with reference to FIG. 2c. Consequently, due to the enhanced surface topography, an increased degree of flexibility may be accomplished by selecting appropriate etch chemistries. In other illustrative embodiments, the planarization process 235, for instance performed on the basis of a CMP process, may be used to remove a portion of the material 230 to expose at least a top surface 210S of the gate stack 210N, as is also indicated by the corresponding dashed line. Upon exposure of the surface 210S, the planarization process 235 may be stopped and an appropriate sequence of etch processes may be applied, for instance for etching through the liners 205, 204 and finally removing the cap layer 216. For example, plasma-assisted etch recipes and/or wet chemical etch recipes may be used, while the gate stack 210P may be reliably covered by the mask material 230. For example, after etching through the liners 205, 204, well-established wet chemical etch recipes on the basis of hot phosphoric acid may be used for removing the cap layer 216 selectively to the liner 215 in the gate stack 210N. Thereafter, the mask material 230 may be removed and the further processing may be continued, as described above. Consequently, also in this case, integrity, in particular of the gate stack 210P with respect to the liner 204P, may be maintained.

In still other illustrative embodiments, the mask material 230 may be provided with appropriate mechanical stability characteristics to act as a fill material for providing sufficient mechanical integrity of the gate stacks 210P, 210N. In this case, the planarization process 235 may be continued, as is indicated by the dashed line 230A, wherein a corresponding highly non-selective CMP recipe may be used, thereby also removing the liners 205, 204 and the cap layer 216 in the gate stack 210N. In other cases, at least the liner 205 may be removed during the planarization process 235, thereby exposing the liner 204, which may then be etched on the basis of hot phosphoric acid, thereby also removing the cap layer 216. Consequently, a highly efficient material removal may be accomplished by the planarization process 235, thereby reducing the complexity of a corresponding etch sequence.

FIG. 2l schematically illustrates the semiconductor device 200 at a manufacturing stage which may substantially correspond to the stage as previously described with reference to FIG. 2h. Hence, the material 230 may cover the transistors 200P, 200N, wherein the spacer 206A is still formed on the gate stack 210P, while the spacer layer 206 may still cover the gate stack 210N. In this configuration, the planarization process 235 may be performed to expose at least the surface portion 210S of the spacer layer 206, as is also indicated by the dashed line, thereby enabling a further material removal by performing a corresponding etch sequence. For instance, a portion of the spacer layer 206 may be removed by hot phosphoric acid and thereafter the liner 205 may be etched, followed by a further etch step on the basis of hot phosphoric acid in order to remove the liner 204 and the cap layer 216 of the gate stack 210N. In still other illustrative embodiments, the planarization process 235 may be continued so as to remove the spacer layer 206 from above the gate stack 210N, thereby exposing the liner 205, which may then be etched in order to expose liner 204. Thereafter, the material 230 may be removed and the portion of the spacer layer 206 and the spacer 206A may be removed, for instance on the basis of hot phosphoric acid, thereby removing the cap layers 216 of both gate stacks 210N, 210P. As previously described, during the corresponding etch process, integrity of the liner 204P may be maintained, due to increased lateral dimensions determined by the spacer 206A. Thereafter, the further processing may be continued as previously described.

In still other illustrative embodiments, the material 230 may be provided with sufficient mechanical stability to enable material removal of the gate stacks 210P, 210N during the planarization process 235. For example, as indicated by the dashed line 230A, the spacer layer 206 and the cap layers 216 may be removed. Thereafter, the remaining material 230A may be removed by a selective etch process and the remaining portions of the spacer 206A and the spacer layer 206 may be etched, for instance by hot phosphoric acid, thereby again maintaining integrity of the liner 204P.

As a result, the present disclosure provides techniques for forming sophisticated gate electrode structures, also referred to as gate stacks, on the basis of a high-k dielectric material in combination with a metal-containing electrode material, the integrity of which may be maintained by a protection liner, which may not be unduly consumed during a corresponding complex sequence for removing dielectric materials that are typically used for encapsulating the gate stacks during the provision of strain-inducing semiconductor alloy. For this purpose, an appropriate mask material may be applied at any appropriate manufacturing stage, which may expose the top portions or gate heads of the gate stacks, while reliably covering the bottom portion thereof.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a protection liner on sidewalls of a first gate stack and a second gate stack, said first and second gate stacks formed on a semiconductor layer and comprising a high-k dielectric material;
    forming a semiconductor alloy in said semiconductor layer laterally offset from said first gate stack on the basis of a spacer structure comprising a spacer element and an etch stop liner while covering said second gate stack by an etch stop layer and a spacer layer;
    removing a first cap layer of said first gate stack and said spacer layer covering said second gate stack by performing an etch process;
    forming an etch mask by depositing a mask material so as to cover a bottom portion of said first and second gate stacks and removing a portion of said mask material to recess the top surface of the etch mask below the top surfaces of the first and second gate stacks and expose a top portion of said first and second gate stacks;
    removing a second cap layer of said second gate stack in the presence of said etch mask, wherein a top surface of the etch mask is recessed below top surfaces of the first and second gate stacks following removal of the second cap layer;
    removing said etch mask; and
    removing a remaining portion of said etch stop layer.

2. The method of claim 1, wherein said protection liner and said first and second cap layers are comprised of silicon nitride.

3. The method of claim 1, wherein said mask material is deposited in a low viscous state.

4. The method of claim 3, wherein said mask material is comprised of an organic material.

5. The method of claim 1, wherein said portion of said mask material is removed by performing an etch process.

6. The method of claim 5, wherein said etch process is performed as a plasma assisted etch process.

7. The method of claim 1, further comprising planarizing said mask material prior to exposing said top portions of said sidewalls of said first and second gate stacks.

8. The method of claim 1, further comprising forming first drain and source regions in said semiconductor layer adjacent to said first gate stack and forming second drain and source regions adjacent to said second gate stack.

9. A method, comprising:
    forming a protection liner on sidewalls of a first gate stack and a second gate stack, said first and second gate stacks formed on a semiconductor layer and comprising a high-k dielectric material and first and second cap layers, respectively;
    forming a protection layer and an etch stop layer over said second gate stack;
    forming an etch mask by depositing a mask material so as to cover a bottom portion of said first and second gate stacks and removing a portion of said mask material to recess the top surface of the etch mask below the top surfaces of the first and second gate stacks and expose a top portion of said first and second gate stacks, wherein the etch mask covers a bottom portion of the protection layer and the etch stop layer; and
    removing the second cap layer of said second gate stack in the presence of said etch mask, and wherein a top surface of the etch mask is recessed below top surfaces of the first and second gate stacks following removal of the second cap layer;
    removing said etch mask; and
    removing a remaining portion of said etch stop layer.

10. The method of claim 9, wherein said protection layer and said first and second cap layers are comprised of silicon nitride.

11. The method of claim 9, wherein said mask material is deposited in a low viscous state.

12. The method of claim 11, wherein said mask material is comprised of an organic material.

13. The method of claim 11, wherein said portion of said mask material is removed by performing an etch process.

14. The method of claim 13, wherein said etch process is performed as a plasma assisted etch process.

15. The method of claim 9, further comprising planarizing said mask material prior to exposing said top portions of said sidewalls of said first and second gate stacks.

16. The method of claim 9, further comprising forming first drain and source regions in said semiconductor layer adjacent to said first gate stack and forming second drain and source regions adjacent to said second gate stack.

17. The method of claim 9, comprising removing the first cap layer of said first gate stack and said spacer layer covering said second gate stack by performing an etch process prior to forming the etch mask and forming a semiconductor alloy in said semiconductor layer laterally offset from said first gate stack on the basis of a spacer structure comprising a spacer element and an etch stop liner.

* * * * *